United States Patent [19]

Mantese et al.

[11] Patent Number: 4,916,115

[45] Date of Patent: Apr. 10, 1990

[54] SELECTIVE LASER PYROLYSIS OF METALLO-ORGANICS AS A METHOD OF FORMING PATTERNED THIN FILM SUPERCONDUCTORS

[75] Inventors: Joseph V. Mantese, Washington; Antonio B. Catalan, Sterling Heights; Jeffrey A. Sell, W. Bloomfield; Martin S. Meyer, Southfield; Andrew M. Mance, Royal Oak, all of Mich.

[73] Assignee: General Motors Corporation, Detroit, Mich.

[21] Appl. No.: 209,496

[22] Filed: Jun. 20, 1988

[51] Int. Cl.$^4$ .......................... B05D 3/06; B05D 5/12
[52] U.S. Cl. ...................................... 505/1; 427/43.1; 427/53.1; 427/62; 427/63; 427/126.3; 427/226
[58] Field of Search ................. 427/62, 63, 43.1, 53.1, 427/226, 126.3; 505/1

[56] References Cited

U.S. PATENT DOCUMENTS 4,292,347  9/1981  Donley ............................. 427/110

OTHER PUBLICATIONS

Gupta et al., "Direct Laser Writing of Superconducting Patterns of $Y_1Ba_2Cu_3O_{7-8}$", Appl. Phys. Lett. 52 (8), Feb. 1988, pp. 665–666.

Gupta et al., "Laser Writing of Copper Lines from Metalorganic Films", Appl. Phys. Lett. 511, 26 Dec. 1987, pp. 2254–2256.

Gross et al., "Laser Direct—Write Metallization in Thin Palladium Acetate Films", J. Appl. Phys. 61(4) Feb. 1987, pp. 1628–1632.

Davison et al., "High Tc Superconducting Films from Metallo—organic Precursors", MRS vol. 99, Dec. 1987 (Boston), pp. 289–292.

Koch et al., "Thin Films and Squids Made from $YBa_2Cu_3Cu_y$", MRS edited by Gubser et al., Apr. 1987 (Anaheim), pp. 81–84.

Guruitch et al., "Preparation and Substrate Reactions of Superconducting Y—Ba—Cu—O films", Appl. Phys. Lett. 51 (13), Sep. 1987, pp. 1027–1029.

Yoshizako et al., "Chemical Etching of High—Tc Superconducting Y—Ba—Cu—O Films in Phosphoric Acid Solution", Jpn. J. Appl. Phys. 26, No. 9 (1987), pp. 533–534.

de Vries et al., "Preparation, Patterning, and Properties of thin $YBa_2Cu_3O_{7-8}$ Films", Appl. Phys. Lett. 52 (22), May 1988, pp. 1904–1906.

Fisanick et al., "CW Laser Etching of $Ba_2YCu_3O_7$ Films ", AIP No. 165, Nov. 1987, pp. 189–196.

Pampalone et al., "Contrast Enhancing Additives for Positive Photoresist", J. Electrochem. Soc. 135, No. 2 (1988), pp. 471–476.

Primary Examiner—Norman Morgenstern
Assistant Examiner—Roy V. King
Attorney, Agent, or Firm—D. N. S. Hartman

[57] ABSTRACT

Fine line superconductors of yttrium-barium-copper were formed on <100> strontium titanate substrates by the completely non-vacuum techniques of metallo-organic deposition in selective laser pyrolysis. Lines 125 micrometers wide were written in a film of metal neodecanoates, using an argon laser, prior to complete pyrolysis. An organic dye which absorbs selective laser light wavelengths, is added to the metallo-organic solution comprising the metal neodecanoates prior to laser exposure, so as to enhance absorption of the laser light at the regions of the metallo-organic film which are subsequently exposed to the laser light. The increased light absorbance at the exposed regions, results in at least partial pyrolysis of the exposed metal neodecanoates. Regions of the metallo-organic film not exposed to laser pyrolysis is developed away using a xylene wash. Subsequent complete pyrolysis of the metal neodecanoates and rapid thermal annealing produced lines having superconducting onsets above 90 K and zero resistance at 40 K.

2 Claims, No Drawings

SELECTIVE LASER PYROLYSIS OF METALLO-ORGANICS AS A METHOD OF FORMING PATTERNED THIN FILM SUPERCONDUCTORS

This invention relates to superconductive materials and more particularly, methods for forming patterned films of superconductive materials.

BACKGROUND OF THE INVENTION

The discovery of materials which are superconductors above the liquid nitrogen temperature of 77 K has prompted intensive efforts to discover new materials having even higher superconducting on-set and zero resistance temperatures. Many of the first applications for these new materials having high superconducting critical temperatures; i.e., High $T_c$ materials, will undoubtedly be in the form of thin film devices and high speed interconnects.

Examples of such superconductive materials prepared using metallo-organic deposition techniques are disclosed in the previously filed U.S. Ser. No. 186,627, entitled "Formation of Film Superconductors by Metallo-Organic Deposition," assigned to the same assignee of the present application, and herein incorporated by reference. Metallo-organic deposition of the thin films superconductors generally involves a three-step process. First, a metallo-organic solution, such as a composition comprising yttrium, barium, and copper neodecanoates, is spin coated onto a suitable substrate. The metallo-organic film is then cured in air at about 500° C. for about five minutes to pyrolize the metallo-organics, so that all that remains on the substrate surface is a film of metal oxides. Finally, the metal oxide film is rapid thermal annealed at an appropriate temperature to promote recrystallization and grain growth within the film. The resulting films prepared in this manner are characterized by superconductive properties above the liquid nitrogen temperature.

In order to exploit the full potential of the thin films of these and other High $T_c$ superconductive materials, it will be necessary to develop patterning methods capable of delineating fine lines and various geometries from the superconductive materials. Present patterning methods currently include: scribing, wet chemical etching, reactive ion etching, local laser ablation, and ion beam amorphization, as well as others. Patterning methods using focused beam techniques; i.e., ion beam, electron beam and laser beam, wherein the focused beam selectively decomposes a film of metal oxide precursors, are disclosed in U.S. Ser. No. 130,135, entitled "Patterning Thin Film Superconductors Using Focused Beam Techniques," which is assigned to the same assignee of the present application.

During patterning by selective laser pyrolysis, focused laser light is scanned across the surface of a precursor film of suitable metallo-organic material to locally pyrolize the metallo-organic material to its metal oxide. It is important, for proper patterning, that the energy intensity of the beam be sufficiently large to convert enough of the precursor metallo-organic material to its oxide to prevent the pattern lines from being removed during development. The low coefficient of light absorbance of some metallo-organics requires either (1) very intense laser energy to render the organic materials insoluble in the solvent or (2) very thick starting precursor films to be used during the patterning process. The use of intense laser beams is undesirable because damage to underlying films and substrates may result from the intense transmitted laser energy. In many cases, the high power densities results in severe substrate crazing therefore forming lines of defects beneath any subsequently formed superconducting lines. These defects tended to produce electrical discontinuities in the lines or serve as fracture points for the strontium titanate during subsequent annealing. Alternatively, the use of thick precursor films is undesirable because the thick films limit the ultimate resolution of the laser patterning process.

Although there are disadvantages, there are also many advantages to using a focused beam of laser light to selectively pattern and pyrolize the metal oxide precursor films so as to form patterned superconductive thin films. First, laser patterning does not require a vacuum; hence, the entire process of patterning and film formation may be done at ambient pressure. Second, laser patterning is a direct-write process requiring no masking layers for patterning. Lastly, selective pyrolysis of the soft metallo-organic precursors renders only the areas exposed by the laser beam insoluble in their organic solvents. Therefore, the unexposed areas may be removed prior to the subsequent pyrolysis and annealing steps by developing and rinsing away with organic solvents.

Therefore, it is desirable to provide a method for forming patterned films of superconductive materials using focused laser light which does not require intense laser energy or unduly thick precursor films. In addition, as new materials with ever increasing superconductive transition temperatures are sought and developed, it is desirable to have a means for forming patterned thin films of these superconducting materials which utilizes non-vacuum techniques, permits complex patterning configurations and is readily compatible with the new materials.

SUMMARY OF THE INVENTION

It is an object of the present invention to provide patterned superconductive thin films.

It is a further object of this invention to provide a method for forming patterned films of superconductive material.

It is still a further object of this invention that these patterned superconductive films be formed by employing a light absorbing dye and a focused laser beam.

In accordance with the preferred embodiment of this invention, these and other objects and advantages are accomplished as follows.

A preferred method is disclosed for increasing the light absorbance of the metal oxide precursor films, without requiring intense laser energy or precursor films of unduly thickness. An appropriate dye or organic compound is added to the starting metallo-organic precursor solutions. The dye is chosen such that the dye will selectively absorb at the wavelength of the focused beam of desired laser light, and therefore enhance the overall laser light absorption of the metallo-organic thin film, permitting lower laser light intensities. In addition, the dye must be compatible with the metallo-organics being used.

Fine line superconductors of yttrium-barium-copper were formed on <100> strontium titanate substrates by the completely non-vacuum techniques of metallo-organic deposition and selective laser pyrolysis. Focused broad band Argon (Ar) laser light was used to selectively pyrolize metal neodecanoates, which were dissolved in a xylene/pyridine solution, to render them insoluble in their solvent, xylene. A dye, 4-[(4-Ethoxyphenyl)azo]-1-naphthol (also referred to a Fat Brown B), was added to the metal neodecanoates to increase the absorption coefficient of the metal neodecanoates by a factor of over 100. By this process, thin films of yttrium-barium-copper (Y-Ba-Cu) were patterned into fine line superconductors.

Lines, 125 micrometers wide, were written, using an argon laser, in the metallo-organic thin film of metal neodecanoates. The exposure of the metallo-organic film to the radiation from the focused laser beam at least partially pyrolizes the metallo-organic film, such that the pyrolized metallo-organics decompose leaving only the metal oxides on the surface of the substrate. Regions of the metallo-organic film not exposed to the laser pyrolysis were developed away using a xylene wash. A final pyrolysis step is performed to ensure complete pyrolysis and decomposition of the patterned metallo-organic film to their metal oxide. The metal oxide film is subsequently rapid thermal annealed. Resistance versus temperature measurements of 125 micrometer wide lines showed superconducting onsets above 90 K and zero resistance at 40 K.

Other objects and advantages of this invention will be better appreciated from a detailed description thereof, which follows.

DETAILED DESCRIPTION OF THE INVENTION

In the present invention, patterned superconductive films are formed using focused laser light. A dye of an appropriate composition is added to the starting metallo-organic solutions so as to increase the light absorbance of the metallo-organic films. The dye selectively absorbs the wavelength of the laser light, thereby enhancing the light absorbance of those regions of the metallo-organic film which are exposed to the laser light. The dye facilitates lower laser intensities thereby avoiding cracking or crazing of the underlying substrate.

The metallo-organic solutions are prepared using carboxylates of yttrium, barium and copper. Other rare earth metals such as europium, ytterbium and lanthanum may replace the yttrium in the solution. The preferred carboxylates for forming the metallo-organic solutions are the neodecanoates of the various metals. We have found that the neodecanoates tend to be more soluble in the xylene/pyridine solution than other carboxylates, such as the 2-ethyl-hexanoate, and therefore result in superior films.

The metal neodecanoates of yttrium and barium were formed by reaction of their metal acetates with ammonium neodecanoates. The copper neodecanoate was formed by reacting copper II acetate with tetramethylammonium neodecanoate. The individual metal carboxylates were dissolved in xylene/pyridine solutions then mixed together in appropriate proportions to give an approximate elemental ratio of Y:Ba:Cu of 1:2:4 upon pyrolysis. Details of the preparation of the metal neodecanoates and the subsequent processing of these materials to produce the non-patterned superconductive films are described in the previously mentioned U.S. Ser. No. 186,627, entitled "Formation of Film Superconductors by Metallo-Organic Deposition," which is herein incorporated by reference.

In summary the metallo-organic solution which resulted in the preferred superconductor film composition of $YBa_2Cu_4O_z$, with z ranging between approximately 6-8, has a ratio of one gram of the combined metal neodecanoates to about one milliliter of solvent. About 13.5 grams of the yttrium neodecanoate, about 40.0 grams of the barium neodecanoate and about 46.54 grams of the copper neodecanoate, yielding a total of about 100 grams of metal neodecanoate, were dissolved in about 100 milliliters of solvent, the solvent comprising about 20 to 25 milliliters of pyridine preferably in a balance of xylene. The metallo-organic solution was continuously stirred for approximately 60 hours, at room temperature, to ensure complete and intimate mixing of the constituents.

A dye, preferably 4-[(4-Ethoxyphenyl)azo]-1-naphthol (also referred to as Fat Brown B) was added to the metal carboxylates to enhance absorption of the argon laser light around its 488 nanometer and 514.5 nanometer lines. Approximately 1 to 10 milligrams, preferably about 5 milligrams, was added to approximately one milliliter of the metallo-organic solution. It appears that about 10 milligrams is the maximum amount of dye that may be added to the metallo-organic solution, since greater than 10 milligrams tends to degrade the superconducting properties of the resulting thin films. In addition, it also appears that at least 1 milligram of dye should be added to the metallo-organic solution, since any less than this amount tends to increase the transmittance of the metallo-organic film rendering the laser pyrolysis ineffective. Approximately 5 milligrams of dye added to the metallo-organic solution is the preferred amount and appears to optimize the superconducting properties of the final patterned lines while providing enhanced absorption. The relationship between the coefficient of absorbance for the metallo-organics appears to increase logarithmically with the amount of dye added.

Further, it is preferred that the dye be added to the metallo-organic solution within an hour of the subsequent processing steps. Preferably, the dye should be added immediately before further processing. There appears to be some detrimental interaction between the metallo-organic solution and dye, resulting in degradation of the final superconducting qualities of the thin films. If the dye is added too early, the quality of the solutions tend to degrade, resulting in poorer quality superconducting films. Therefore, it is desirable to minimize the amount of reaction time between the dye and metallo-organics.

The dye may be varied depending on the type of laser light used or the metallo-organic films being patterned. The appropriate organic dye should selectively absorb the wavelengths of the light generated by the particular laser. The 4-[(4-Ethoxyphenyl)azo]-1-naphthol dye was preferred to enhance absorption of the metal carboxylates, because that dye has a high absorption of the argon laser light around its 488 nanometer and 514.5 nanometer wavelength lines. In addition, the dye must be soluble in the organic solvent being used, in this case xylene being preferred. Further, the dye must be compatible with the metallo-organics, so as not to significantly degrade the superconducting properties of the resulting films. Therefore, depending on the starting materials and emitted wavelengths of the laser, alternate organic dyes may be preferred.

The metallo-organic solution comprising the metal neodecanoates and dye was spun onto <100> strontium titanate (SrTiO$_3$) single crystals at 1,000 revolutions per minute, then baked at 135° C. for 15 minutes to drive off the xylene/pyridine solvents. A film of the metal neodecanoates and dye remain on the substrate surface. After the 135° C. bake, the metallo-organic film was found to be approximately 3.5 micrometers thick. It is believed that the baking step may not be necessary and may not be preferred. As stated previously, the dye appears to detrimentally interact with the metallo-organic solution. The baking step may actually accelerate this interaction; and therefore, we have sought to avoid this step. The viscosity of the metallo-organic solution is about 14 centipoise.

A 1.1 W broad band Ar laser beam approximately 100 micrometers in diameter (full width at half maximum power) was focused onto the metallo-organic surface and scanned at a speed of approximately 32 micrometers per second to pattern and therefore selectively pyrolyze the spun-on film. The laser energy was distributed among 8 wavelengths, but included 0.46 W at 514.5 nanometers and 0.28 W at 488 nanometers. The laser patterning was done in one atmosphere of oxygen. After selective laser beam exposure, the films were developed in xylene for 30 seconds to remove the unexposed areas of the metallo-organic film.

The power density of the laser appears to be an important parameter. Approximately 14 kilowatts per square centimeter was the preferred power density for forming these films, using approximately 5 milligrams of dye; however, it may range between about 10 to 30 kilowatts per square centimeter with good quality superconducting films being the result. It is preferred to expose at as low a power density as possible, so as to retain good resolution and avoid any damage to the underlying substrate. The power density is inversely related to the amount of dye used. Therefore, it is important to balance the desire for low power density with the competing desire for a low quantity of dye which minimizes degradation of the superconducting properties. It appears that a power density of approximately 14 kilowatts per square centimeter with approximately 5 milligrams of this dye is the optimal processing parameter for these materials. The power density, laser type and emitted wavelengths, scanning speed, and amount of dye may be varied depending on the materials and desired properties.

As determined from transmittance curves for 3.5 micrometer thick metal neodecanoate films both with and without the dye, there is a substantial enhancement in the absorption around 488 nanometers and 514.5 nanometers in the films comprising the dye. The absorption coefficient at 488 nanometers increases from approximately 14 centimeters$^{-1}$ to approximately 1,761 centimeters$^{-1}$ by the addition of approximately 5 milligrams of dye. The absorption coefficient at 514.5 nanometers similarly increased from approximately 14 centimeters$^{-1}$ to approximately 1,631 centimeters$^{-1}$ It is believed that with the appropriate laser parameters, film characteristics, and absorbing dye, that the metallo-organic films could be fully pyrolyzed, so as to decompose the metallo-organics to their respective metal oxides, with a single exposure of radiation from the focused laser beam. In that case, with a single, complete pyrolysis step, no further pyrolyzing is required and the metal oxides films would only need to be annealed, such as by rapid thermal annealing, to result in the patterned superconductive films. However, a second pyrolysis step was performed to ensure complete decomposition of the metallo-organics to their respective metal oxides.

It is believed that pyrolysis occurs in the metallo-organic films after exposure to the selected wavelengths of the laser by either: (1) photothermal means wherein heat generated in the metallo-organics causes thermal decomposition to occur, or (2) photochemical means wherein the molecular bond within the metallo-organics is excited by a particular emitted wavelength causing breakage of the molecular bond. The pyrolysis may also occur due to a combination of both means for decomposition.

Therefore, the patterned neodecanoates were further pyrolyzed at approximately 500° C. in air for approximately five minutes to fully convert the metal neodecanoates to their oxides. After complete pyrolysis, x-ray diffraction analysis of the films should reveal the presence of only microcrystallites distributed uniformly throughout the films. In addition, after this step, the metal oxides films did not exhibit superconducting properties.

Thermogravimetric analysis shows that the metal neodecanoates volatilize and decompose at different temperatures. Complete decomposition of the combined yttrium, barium, and copper neodecanoates used in this invention occurs at about 450° C., leaving only the yttrium, barium, and copper oxides on the substrate in an amount proportional to the original metallo-organic solutions. We found that if the patterned and partially pyrolyzed films are immediately placed in a furnace set at about 500° C., complete and uniform pyrolysis occurs concurrently in all of the neodecanoates, resulting in quality thin films of the superconducting composition. 500° C. appears to be the optimal temperature for pyrolysis, although the temperature may range between just above 450° C. where complete decomposition occurs for all of the metal neodecanoates, and about 600° C. thereby avoiding any significant recrystallization.

After complete pyrolysis of the patterned films, the films were rapid thermal annealed using infrared radiation, in flowing oxygen, at approximately 850° C. for 60 seconds and then allowed to cool to room temperature. This was followed by a second rapid annealing in oxygen at approximately 920° C. for 30 seconds. The patterned films are heated very rapidly by exposing the patterned films to a bank of quartz lamps and electromagnetic radiation.

Although this two-step rapid thermal annealing process is preferred, it is not necessary. A single rapid thermal annealing may be used with a duration of about an instantaneous amount of time up to about two minutes and at a temperature of about 850° C. to about 1000° C. In addition, conventional furnace annealing cycles of long duration may be used. However, the two-step rapid thermal annealing step has been found to result in superconductive films of superior quality. We believe that the lower temperature first rapid thermal annealing promotes recrystallization while the second higher temperature rapid thermal annealing promotes rapid grain growth. The superconducting lines which were patterned by selective laser pyrolysis in accordance with this methods are composed of many crystallites, which may account for the low zero resistance temperature of about 40 K.

The patterned superconducting lines were approximately 230 nanometers thick after complete pyrolysis and rapid thermal annealing. Lines of varying thickness may be formed with this method, by varying the thickness of the precursor metallo-organic film, depending on the application. However, as the thickness of the starting precursor film increases, the resolution of the final patterned lines decreases. Also, various configurations may be formed with relative ease, since the laser is a direct-write process requiring no complex chemical or physical masks.

Resistance as a function of temperature was determined for several 125 micrometer wide lines electrically connected in parallel but spatially separated by center-to-center distances of approximately 1 millimeter. A superconducting onset temperature above 90 K was observed with a zero resistance temperature determined to be about 40 K. The broad transition to full superconductivity in the patterned films formed in accordance with this invention, as evidenced by the large difference in temperatures between the zero resistance temperature and the superconductivity onset temperature, is believed to arise from strontium outward diffusion from the substrates into the thin films or by the presence of residual carbon left after pyrolysis from the dye. Strontium substitution for barium in the yttrium-barium-copper superconductors has been shown to lower the superconducting transition temperatures in these compounds.

With this invention, patterned superconducting thin films of various compositions may be formed. This invention readily facilitates modification of the focused laser beam parameters, metal constituents and their ratios within the thin films, and patterned configurations, to obtain the optimal superconducting film characteristics. While our invention has been described in terms of a preferred embodiment, it is apparent that other forms could be adopted by one skilled in the art, such as by substituting the strontium titanate substrate with substrates of barium titanate, sapphire, magnesium oxide, zirconium oxide, or silicon/silicon oxide with the appropriate diffusion barrier, or by substituting the metal neodecanoates and their ratios with other materials and substituting an appropriate dye having the light absorbing qualities desired. It is also foreseeable that laser techniques could be used to promote recrystallization and grain growth within the metal oxide films, thereby replacing rapid thermal or conventional annealing steps. Accordingly the scope of our invention is to be limited only by the following claims.

The embodiments of the invention in which an exclusive property or privilege is claimed are defined as follows:

1. A method for forming patterned films of superconductive materials consisting essentially of the steps of:
   (a) forming a solution from the neodecanoates of yttrium, barium and copper, said neodecanoates forming an oxide mixture exhibiting superconductive properties upon subsequent thermal decompositions wherein said oxide mixture is characterized by a ratio of yttrium:barium:copper of approximately 1:2:4, said solution comprising an organic solvent such as xylene;
   (b) adding to said solution an appropriate dye, said dye comprising 4-[(4-Ethoxyphenyl)axo]-1- naphthol and capable of absorbing a selective wavelength of light;
   (c) depositing a film of said solution having said dye onto a strontium titanate substrate;
   (d) exposing selective regions of said film with an Argon laser emitting said wavelength of light, such that said exposed regions of said film become insoluble in said xylene;
   (e) immersing said film into said xylene so that the soluble, unexposed regions of said film are removed from said substrate;
   (f) heating said film at a first temperature of about 500° C. and duration that is sufficient to thermally decompose said neodecanoates of yttrium, barium and copper into a film containing yttrium, barium and copper oxides in the ratio of approximately 1:2:4 respectively, but insufficient to significantly recrystallize said oxides; and
   (g) heating said oxide film at a second temperature ranging between approximately 850° C. and 1000° C. for a duration of up to about two minutes, sufficient to promote recrystallization and grain growth of said metal oxides within said film and induce a change therein by which said film exhibits superconducting properties.

2. A method for forming patterned films of superconductive materials as recited in claim 1 wherein:
   said oxide film is heated to a second temperature of approximately 850° C. for a duration of about 60 seconds, cooled to room temperature, then heated to a third temperature of approximately 920° C. for a duration of about 30 seconds.

* * * * *